United States Patent [19]

Katou et al.

[11] 4,086,541

[45] Apr. 25, 1978

[54] TIME DIVISION MULTIPLEXING AMPLIFIER

[75] Inventors: Kazuo Katou, Ibaraki; Takashi Sase; Ikuho Horinaka, both of Hitachi, all of Japan

[73] Assignee: Hitachi, Ltd., Japan

[21] Appl. No.: 749,805

[22] Filed: Dec. 13, 1976

[51] Int. Cl.² .................................. H03F 1/14
[52] U.S. Cl. ................................ 330/51; 330/9; 330/69
[58] Field of Search ............... 328/151; 330/9, 51, 330/69

[56] References Cited
U.S. PATENT DOCUMENTS
3,304,507  2/1967  Weekes et al. ................. 328/151

Primary Examiner—Lawrence J. Dahl
Attorney, Agent, or Firm—Craig & Antonelli

[57] ABSTRACT

A time division multiplexing amplifier having a differential amplifier, such as a dynamic bridge amplifier, which has a predetermined gain accurately provided by means of operational network resistors. The differential amplifier is used to amplify differential signals containing a common-mode voltage. Prior to amplification of the differential signals, a common-mode voltage is applied in common to two input terminals of the differential amplifier, and then the differential amplifier is adjusted to provide a zero offset voltage. After that, the differential signals are applied to the differential amplifier, so that the differential signals can be amplified without having any adverse effect of a common-mode voltage.

9 Claims, 4 Drawing Figures

TIME DIVISION MULTIPLEXING AMPLIFIER

BACKGROUND OF THE INVENTION

The present invention relates to a time division multiplexing amplifier which is used to amplify differential signals, and more particularly to a differential amplifier providing a high common-mode rejection ratio.

In the case where a transducer is provided with its output stage having a balanced-output type circuit arrangement like a bridge circuit or the other devices like a thermo-electric device, from which a very small differential output signal is derived, the differential output signal frequently involves a relatively large amount of common-mode noise voltage with respect to ground and, therefore, it is necessary to eliminate the adverse effect of the common-mode voltage in order to accurately amplify the differential signal voltages. For example, in order to amplify a 10 mV differential signal voltage involving a 10 V common-mode voltage with accuracy of 0.1%, an overall common-mode rejection ratio of the amplifier is required to be as high as 10 V/10 $\mu$V = 1,000,000 or 120 db since 0.1% of 10 mV is 10 $\mu$V.

If there are a plurality of signal sources, a single differential amplifier has to amplify a plurality of signals supplied from these sources through a switching device, but a different signal source has a different common-mode voltage. Therefore, if the common-mode rejection ratio for a particular common-mode voltage is improved, the improvement is effective only for the particular signal source and never for any of the remaining sources. It is also necessary to consider the adverse effect of stray capacitance and leakage resistance of the circuit on the performance of the amplifier, since signals to be processed are very weak.

The conventional method of amplifying differential signal voltages containing common-mode voltages may be generally classified into the following two types:

One method is to amplify the differential signal voltages by means of an isolated amplifier: This method uses elements which handle signals in an electrically isolated condition, such as pulse transformers and semiconductor photo-couplers, so that the input stage of the amplifier or the whole amplifier is isolated from the common-mode voltage. In this method, high common-mode voltage inputs are allowable because some insulating parts are capable of withstanding high voltages. However, the use of the pulse transformer isolation may not offer sufficiently high differential input impedance, while the use of the semiconductor photo-coupler isolation may not offer sufficient linearity in signal transmission. Therefore, accurate amplification may not be achieved in either case. In addition, this method will cause the circuit to be complicated and costly.

Another method is to amplify the differential signal voltage by means of a direct-coupled non-isolated differential amplifier: This method uses a feedback amplifier which has a balanced input stage adapted to present high input impedance against the common-mode voltage and also which provides accurately a predetermined amplification factor for the differential signal voltages. In general, this type of differential amplifier is called an instrumentation amplifier or data amplifier; for example, a dynamic bridge amplifier composed of three differential input operational amplifiers and four or more precision operational network resistors. In this type of differential amplifier, the common-mode rejection ratio, which represents the degree of elimination of the adverse effect of a common-mode voltage, depends on the common-mode rejection ratio of the differential input operational amplifier to be used and also on the accuracy of operational resistors to be used. Various attempts have been made in the past to adjust both amplifiers and resistors so as to obtain a maximum common-mode rejection ratio, but it has been still difficult to obtain a stable and high common-mode rejection ratio.

SUMMARY OF THE INVENTION

It is a primary object of this invention to improve the common-mode rejection ratio for a time division multiplexing amplifier which is used to amplify differential signal voltages containing common-mode voltages.

It is another object of the invention to improve the common-mode rejection ratio by making up a simple circuit arrangement.

It is another object of the invention to provide a time division multiplexing amplifier for high precision signal amplification by eliminating the influence of temperature, power supply, leakage and so on.

It is another object of the invention to provide a time division multiplexing amplifier which may be simply adjusted to improve the common-mode rejection ratio.

It is another object of the invention to provide a time division multiplexing amplifier capable of high speed and high precision scanning, which scans sequentially on time division basis a plurality of low level differential signal voltages, each containing a different common-mode voltage. This may be achieved by reducing the adverse effect of each common-mode voltage.

According to one aspect of the invention, there is provided a differential amplifier which may be adjusted to provide its zero offset voltage by applying only a common-mode voltage to two input terminals thereof prior to amplification of any differential signal voltage, and then to which the differential signal voltage is applied for amplification.

In further accordance with the invention, the overall offset voltage in the differential amplifier including operational network resistors, which is caused by a common-mode voltage, may be detected by sample holding means, and the common-mode rejection ratio may be improved by using negative feedback of the offset voltage. A dynamic bridge amplifier may be used as the differential amplifier, and the final stage of the dynamic bridge amplifier composed of the differential input operational amplifiers may be provided with an offset control input and controlled by applying negative feedback of the output of a sample holding circuit to the offset control input. In scanning on a time division basis a plurality of differential signal voltages to be measured, each containing a different common-mode voltage, the offset voltage caused by the common-mode voltage may be first adjusted to be zero for each selection of the different signal voltage, and then the differential signal voltage corresponding to the offset voltage may be measured. The output stage of the differential amplifier may be provided with a sample holding circuit capable of sampling and holding an output voltage from the differential amplifier after the differential signal voltage is applied to the differential amplifier and then offset adjustment is completed.

In still further accordance with the invention, a time division multiplexing amplifier may be provided with high-input-impedance buffer amplifiers for deriving a common-mode voltage to be applied to the differential amplifier and switches for bypassing the buffer amplifiers to supply differential signals to the differential amplifier so that a high common-mode rejection ratio is obtained without any adverse effect of the stray capacitance in the circuit. A guard shield may be provided for a common signal line, and connected to the output of the buffer amplifiers by which circuit arrangement an error due to the common-mode voltage can be minimized when unbalanced resistance and capacitance exist in a filter circuit or when the differential signal voltage source to be measured is capacitive.

DETAILED DESCRIPTION OF THE INVENTION

Figure 1:
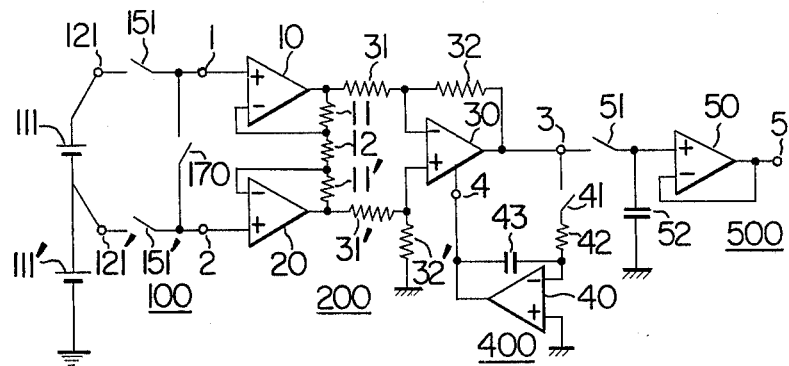
FIG. 1 shows a schematic diagram of the time division multiplexing amplifier for differential signal voltages according to the present invention.

FIG. 1 shows a preferred embodiment of the time division multiplexing amplifier for differential signal voltage according to this invention. In FIG. 1, signal sources are a differential signal voltage source 111 and a common-mode voltage source 111', and the time division multiplexing amplifier is composed of an input switch section 100, a differential amplifier section 200, a sample holding circuit section 400 for negative feedback, and another sample holding circuit section 500 for a buffer amplifier.

The switching section 100 is made up of a pair of electronic switches 151 and 151', and an electronic switch 170. One end of the switch 151 is connected to the input terminal 1 of the differential amplifier section, and one end of the switch 151' to the input terminal 2. The switch 170 is connected between the terminals 1 and 2 of the differential amplifier section.

The differential amplifier section 200 is a so-called dynamic bridge amplifier, which has input terminals 1 and 2, an output terminal 3, and an offset control terminal 4. In this differential amplifier section, a balanced input stage of high impedance is composed of differential input operational amplifiers 10 and 20, and operational network resistors 11, 11' and 12, and also a bridge amplifier output stage is composed of a differential input operational amplifier 30 and operational network resistors 31, 31', 32 and 32'. The terminal 4 of the differential input operational amplifier 30 is for offset control.

The sample holding circuit section 400 is an integrator composed of an operational amplifier 40, an input resistor 42, and an integrating capacitor 43. The input of this circuit is connected through an electronic switch 41 to the output terminal 3 of the differential amplifier section 200, and the output is connected to the offset control terminal 4 in negative feedback mode.

The sample holding circuit section 500 is composed of an operational amplifier 50 provided with a high input impedance, an electronic switch 51, and a holding capacitor 52. The input and output of this section are connected respectively to the output terminal 3 of the differential amplifier section 200 and to the output terminal 5.

Figure 2:
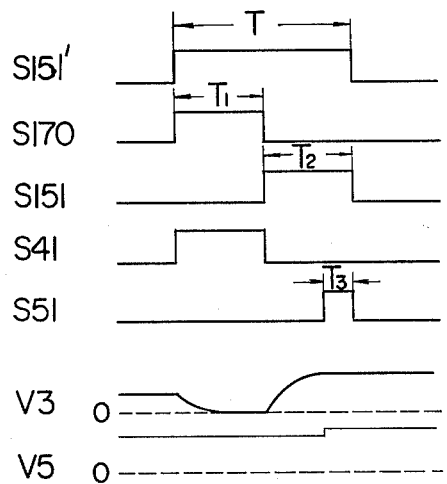
FIG. 2 shows waveforms illustrating the operation of the circuit shown in FIG. 1.

An operational timing diagram for the circuit of FIG. 1 is shown in FIG. 2. S and V in FIG. 2 represent voltages respectively at the switches and terminals shown in FIG. 1, and their suffix numbers correspond to the reference numerals of the electronic switches and terminals shown in FIG. 1. The operation of the embodiment of this invention shown in FIG. 1 is described hereunder with reference to the waveforms shown in FIG. 2.

In amplifying the differential signal voltage 111 which contains the common-mode voltage 111', the operational cycle T consists of time intervals $T_1$ and $T_2$. During the time interval $T_1$ (offset control period), the series electronic switch 151' and the parallel switch 170 are closed in the input switch section 100, and the electronic switch 41 in the sample holding section 400 is also closed. In this condition, both terminals 1 and 2 evenly receive only the common-mode voltage 111' and no signal voltage. The common-mode voltage thus applied to the terminals is converted into a differential signal component by the differential input operational amplifier and operational resistors in the differential amplifier section 200, and appears at the terminal 3 as offset output voltage. This offset voltage is amplified by the sample holding section 400, and then the negative feedback of the offset voltage is applied to the offset control terminal 4 of the differential input operational amplifier 30. As a result, the offset voltage at the terminal 3 is sharply decreased to substantially zero volt. The false voltage in the differential amplifier section 200, which is caused by the common-mode voltage 111', is eliminated in this way.

During the time interval $T_2$ (amplification period) following the above interval $T_1$, the electronic switches 170 are opened and the electronic switches 151, 151' are closed. In this condition, the differential voltage from the source 111 is applied between terminals 1 and 2, and amplified in accordance with a predetermined amplification factor of the differential amplifier section 200. The electronic switch 51 is closed during the time interval $T_3$ (later part of $T_2$) after the output voltage V3 from the amplifier section 200 is settled, so the amplified signal appears at the output terminal 5 as output voltage V5.

If variations in common-mode voltage are practically negligible during the period of $T_1$ and $T_2$, the signal voltage amplified during the time interval $T_2$ may not be affected by the common-mode voltage since the adverse effect of the common-mode voltage has been eliminated during the time interval $T_1$. The capacitor 52 is charged or discharged to the potential at the output terminal 3 immediately after the electronic switch 51 is closed, because the output impedance of the differential input operational amplifier 30 is very low.

More detailed description is made hereunder on the common-mode rejection ratio improvement by means of the differential amplifier section 200, with reference to the above-described arrangement and operation.

In FIG. 1, the equivalent offset error voltage ($E_{off}$) referred to input of the differential amplifier 200 is expressed as follows:

$$E_{off} = \frac{E_{off_1}}{1 + K_1 \cdot K_2 \cdot K_3} + \frac{E_{off_2}}{K_1 + \frac{1}{K_2 \cdot K_3}} \qquad (1)$$

wherein $E_{off_1}$: Equivalent offset error voltage referred to input of the differential amplifier 200 produced before offset adjustment $E_{off_2}$: Equivalent offset error voltage referred to input of the sample holding section 400, $K_1$: Gain of differential amplifier section 200, $K_2$: Gain of sample holding circuit section 400, $K_3$: Gain of an offset control circuit, i.e., equivalent voltage variations referred to input of the differential amplifier section 200 with respect to a voltage applied to the terminal 4.

For example, assuming that a common-mode voltage Ec is equal to 10 V under the conditions of $K_1 = 1000$, $K_2 = 1000$, $K_3 = 0.01$, $E_{off_1} = 10$ mV, and $E_{off_2} = 1$mV, then $E_{off}$ is approximately 2 $\mu$V. This means that a common-mode rejection ratio $Ec/E_{off}$ is improved from  $(E_c/E_{off_1}) = (10 \text{ V}/10 \text{ mV}) = 1,000$ to    $(E_c/E_{off}) = (10 \text{ V}/2 \text{ }\mu\text{V}) = 5,000,000$.

In the embodiment of this invention shown in FIG. 1, it should be noted that the electronic switch 170 is closed prior to the time interval $T_2$. The differential amplifier section 200 will be placed in a desirable reference state by closing the switch 170. Therefore, if many possible disturbances other than common-mode voltages, such as line voltage fluctuations, temperature variations, leakage in circuit boards, and so on, can be regarded as being substantially constant with time during the whole period of $T_1$ and $T_2$, then their adverse effects also can be eliminated in the same manner as that of the common-mode voltage is done with. Further, if some possible stray capacity between the input terminals 1 and 2 of the differential amplifier section 200 is charged with a previous signal voltage, the charge will be discharged without fail because the electronic switch 170 is closed prior to the time interval $T_2$ for amplification. Therefore, any effect of that charge will not be left on the next amplification.

In FIG. 1, the sample holding section 500 may be omitted unless it is necessary to obtain the continuous outputs from the amplifier in such a case as the outputs are subjected to a synchronous analog-to-digital conversion.

Various operation modes are possible; periodical offset control and amplification may be performed alternately at a certain repetition rate, intermittent offset control may be performed at irregular intervals prior to amplification, and a whole cycle, except for an amplification period, may be provided for offset control. The common-mode rejection ratio improvement as described hereinbefore may be achieved in either mode.

FIG. 13 shows another preferred embodiment of the present invention. This is a so-called analog multiplexer, which is a time division multiplexing amplifier adapted to be connected to a plurality of signal sources of capacitive impedance. For such applications, it is essential to take it into consideration to minimize disturbances which the amplifier gives to the respective signal sources in the case of selecting the respective signal sources by switches for amplification. For this purpose, as described later, the embodiment shown in FIG. 3 comprises a means for allowing the switches and the amplifier to operate quite symmetrically with respect to the signal source (i.e., in a balanced state), and a means for minimizing the stray capacity in the circuit on each signal source.

Figure 3:
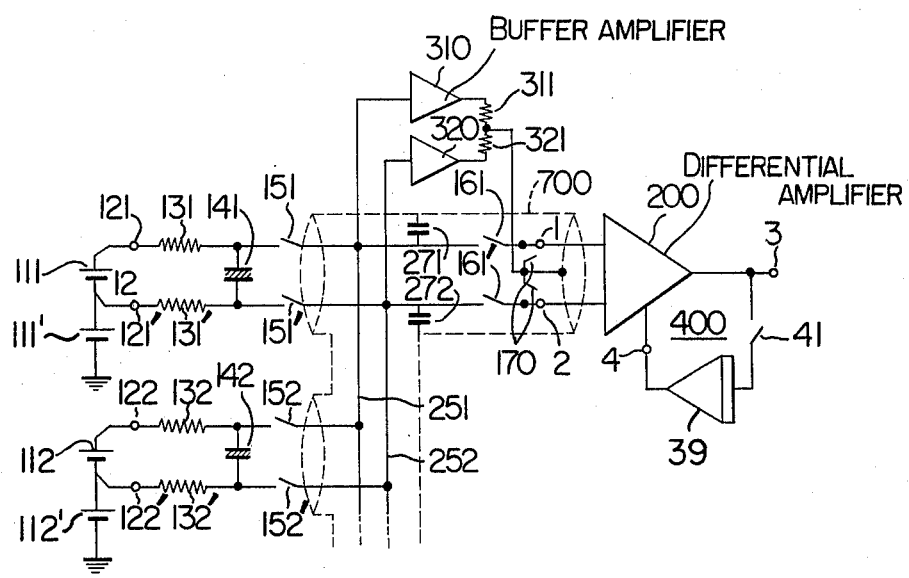
FIG. 3 shows a schematic diagram of a time division multiplexing amplifier for a plurality of differential signal voltages according to the present invention.

In FIG. 3, a pair of input terminals 121 and 121' of the multiplexer is connected to the differential signal source 111 with the common-mode voltage source 111', and input signals will be introduced through a CR filter composed of resistors 131 and 131' and a capacitor 141 to a pair of electronic input switches 151 and 151'. The two respective outputs of each of all electronic input switches are connected in common to the common signal lines 251 and 252, respectively. The common signal lines 251 and 252 are connected respectively through a pair of electronic switches 161 and 161' to the input terminals 1 and 2 of the differential amplifier section 200. The common signal lines 251 and 252 are also connected respectively to the inputs of high-input-impedance buffer amplifiers 310 and 320 which have an approximate gain of unity. The mean value of outputs from these buffer amplifiers is established by resistors 311 and 321, and coupled to an electronic input shorting switch 170 of differential amplifier section 200. The output of the differential amplifier 200 is connected to the sample holding circuit section 400 which is composed of an electronic switch 41 and an integrator circuit 39. The output of the sample holding circuit section 400 is connected to the offset control terminal 4 of the differential amplifier section 200 so as to apply negative feedback thereto.

The signal lines 251 and 252 have a guard shield 700 which is connected to the output from the buffer amplifiers 310 and 320. Stray capacities between the guard shield 700 and the common signal lines 251 and 252 are represented by 271 and 272, respectively.

Figure 4:
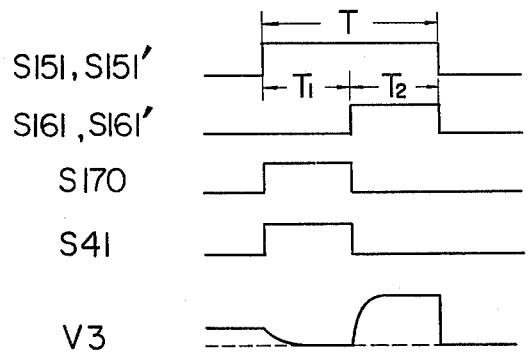
FIG. 4 shows waveforms illustrating the operation of the circuit shown in FIG. 3.

The operation of the circuit in FIG. 3 is described hereunder with reference to the timing diagram shown in FIG. 4. In order to scan signals from the signal source 111 with the common-mode voltage source 111', during a time interval $T_1$, the electronic switches 161 and 161' are open, and at the same time, the electronic switches 151 and 151' for input selection, the electronic switch 170 for shorting input of the differential amplifier section 200, and the electronic switch 41 for the sample holding circuit are all closed. In this condition, a signal voltage and a common-mode voltage are both applied between the common signal lines 251 and 252. The stray capacity 271 is charged through the filter resistor 131 and the electronic switch 151, and the stray capacity 272 is charged through the filter resistor 131' and the electronic switch 151'; thus charging currents flow separately to charge them in a balanced state. Therefore, assuming that filter resistors 131 and 131' have an equal value and that stray capacities 271 and 272 have an equal value, currents charging the stray capacities do not flow through the filter capacitor 141.

On the other hand, the common-mode voltage and signal voltage are applied to the buffer amplifiers 310 and 320, the output from which is applied to the differential amplifier section 200 as a common-mode voltage. This voltage is an average of potentials at the terminals 121 and 121' of the signal source. As a result of the application of this common-mode voltage to the differential amplifier section 200, an offset voltage is produced at the output of the differential amplifier section 200. This offset voltage is coupled through the electronic switch 41 and the sample holding circuit section 400 to the offset control terminal 4 for negative feedback, so that the offset voltage at the terminal 3 is gradually decreased and settled to zero.

During a time interval $T_2$ following $T_1$, the electronic switches 170 and 41 are opened, and the electronic switches 161 and 161' are closed to apply a signal to the differential amplifier section 200. In this condition, the signal is accurately amplified by the differential amplifier section 200 which has been adjusted to have no offsetting factor, and extracted from the output terminal 3. After the above operations, the electronic switches 151 and 151' are both opened; this concludes a whole scanning period for the signal source 111.

The following description may help to understand the fact that possible stray capacities 271 and 272 have no effect on signal sources. The effect of stray capacities on signals is mainly due to the fact that when stray capacities are charged with a common-mode voltage, part of the charging currents flows through a filter capacitor 141. If there is a difference in value between filter resistors 131 and 131', or between stray capacities 271 and 272, a voltage is applied across the capacitor 141 while charging currents flow through the stray capacities, and this causes a fault voltage to be charged in the capacitor 141. In FIG. 3, however, the potential at the guard shield 700 is equal to those at the common signal lines 251 and 252 in a final part of the sampling period $T_1$ because the guard shield 700 is connected to the output of the buffer amplifiers 310 and 320. The charges in stray capacities 271 and 272 are discharged through the same path as were charged, and, of course, the charged amount is equal to the discharged one. Even if the filter capacitor 141 is charged by part of the currents flowing when the stray capacities are charged, it will discharge the same amount of charges when the stray capacities discharge. Therefore, the voltage across the filter capacitor 141 is kept unchanged both before and after a sampling period $T_1$. This means that no false voltage will appear. By nullifying the difference between charging and discharging amounts of stray capacities for each signal source, as described above, it is possible to avoid crosstalk, which is a kind of common-mode voltage between signal sources.

In this kind of circuit, a false voltage is proportional to the product of false charge and scanning rate. A reduction in error due to stray capacity may result in an increase in scanning rate for signal sources.

FIG. 3 shows a most preferable example which includes two buffer amplifiers, 310 and 320. With a single buffer amplifier, however, the common-mode rejection ratio may be sufficiently improved.

According to the present invention, as described above, prior to amplification, the offset voltage at the output terminal of a differential amplifier is nullified, with the differential input terminals shorted, so as to eliminate effects of common-mode voltages, temperature variations, line voltage fluctuations, leakage and so on. As a result, high precision amplification of signals may be obtained.

We claim:

1. A time division multiplexing amplifier for receiving a differential-mode signal involving a common-mode voltage and producing an amplified differential-mode signal, comprising:
    a first terminal and a second input terminal to which said differential-mode signal from an external differential-mode signal source is applied;
    an output terminal;
    differential amplifier means including at least one differential amplifier and having a first input and a second input, an output connected to said output terminal, and an offset signal control terminal;
    a pair of first switching means, said first and second inputs being connected to said first and second terminals through one of said first switching means, respectively;
    second switching means, connected between said first and second inputs of the differential amplifier means, for short-circuiting said first and second inputs and applying said common-mode voltage to said first and second inputs during a predetermined period of time when one of said first switching means is closed prior to amplification of said differential signal; and
    first sample holding means, connected between said output and offset signal control terminal of said differential amplifier means, for adjusting to zero an offset voltage produced by said differential amplifier means when said common-mode voltage is applied to said first and second inputs.

2. A time division multiplexing amplifier according to claim 1, wherein said differential amplifier comprises a plurality of differential operational amplifiers and operational network resistors, an operating point of at least one of said operational amplifiers nearest to a final stage of said differential amplifier being controlled in accordance with an output signal from said first sample holding means.

3. A time division multiplexing amplifier according to claim 1, further comprising second sample holding means, connected between said output of the differential amplifier means and said output terminal, for sampling and then holding an output signal of said differential amplifier means after said offset voltage is adjusted to zero.

4. A time division multiplexing amplifier according to claim 1, wherein said differential amplifier comprises a dynamic bridge amplifier having a plurality of differential operational amplifiers, and one of said operational amplifiers which is located at the final stage of said differential amplifier has an offset signal control terminal, an output of said first sample holding means being connected to said offset signal control terminal in a negative feedback mode.

5. A time division multiplexing amplifier for selectively receiving a differential-mode signal involving a common-mode voltage from a plurality of external differential-mode signal sources to be measured and producing an amplified differential-mode signal, comprising:
    a plurality of input terminals correspondingly and respectively connected to a plurality of said external differential-mode signal sources;
    an output terminal;
    a differential amplifier having two inputs, an output connected to said output terminal, and an offset signal control terminal;
    a common signal line;
    first switching means, connected between said common signal line and a plurality of said input terminals, for selectively connecting one of said input terminals to said common signal line;
    second switching means connected between said common signal line and said two inputs of the differential amplifier;
    third switching means connected between said two inputs;
    a common-mode voltage generating means, connected between said common signal line and said third switching means, for supplying said common-mode voltage to said two inputs of the differential amplifier when said second switching means is opened and third switching means is closed;

first sample holding means, connected between said output and said offset signal control terminal, for adjusting to zero an offset voltage produced by said differential amplifier when said common voltage is applied to said two inputs.

6. A time division multiplexing amplifier according to claim 5, wherein said common-mode voltage generating means comprises at least one buffer amplifier.

7. A time division multiplexing amplifier according to claim 6, wherein said third switching means comprises two series-connected switches, said two switches performing on-off operation simultaneously, an output of said buffer amplifier being connected to a common junction point of said two switches.

8. A time division multiplexing amplifier according to claim 6, wherein said multiplexing amplifier further comprises a guard shield for said common signal line, said guard shield being connected to the output of said buffer amplifier.

9. A time division multiplexing amplifier for selectively receiving a differential-mode signal involving a common-mode voltage from a plurality of external differential-mode signal sources to be measured and producing an amplified differential-mode signal, comprising:

a plurality of input terminals correspondingly and respectively connected to a plurality of said external differential-mode signal sources;

an output terminal;

a differential amplifier having two inputs, an output, and an offset signal control terminal;

a common signal line;

first switching means, connected between said common signal line and a plurality of said input terminals, for selectively connecting one of said input terminals through a filter circuit to said common signal line;

second switching means connected between said common signal line and said two inputs of the differential amplifier;

third switching means connected between said two inputs;

at least one buffer amplifier, connected between said common signal line and said third switching means, for supplying said common-mode voltage to said two inputs of the differential amplifier when said second switching means is opened and said third switching is closed;

first sample holding means, connected between said output and said offset signal control terminal, for adjusting to zero and offset voltage produced by said differential amplifier when said common voltage is applied to said two inputs;

a guard shield disposed on said common signal line and connected to the output of said buffer amplifier for shielding said common signal line; and second sample holding means, connected between said output terminal and the output of said differential amplifier, for sampling and then holding an output of the differential amplifier when said second switching means is closed and said third switching means is opened after said offset voltage is adjusted to zero.

* * * * *